United States Patent [19]
Kasai

[11] Patent Number: 5,913,121
[45] Date of Patent: Jun. 15, 1999

[54] METHOD OF MAKING A SELF-ALIGNING TYPE CONTACT HOLE FOR A SEMICONDUCTOR DEVICE

[75] Inventor: Naoki Kasai, Tokyo, Japan

[73] Assignee: NEC Corporation, Tokyo, Japan

[21] Appl. No.: 08/899,384

[22] Filed: Jul. 23, 1997

Related U.S. Application Data

[62] Division of application No. 08/805,564, Feb. 25, 1997, Pat. No. 5,821,594.

[51] Int. Cl.[6] .................................................. H01L 21/336
[52] U.S. Cl. ......................... 438/287; 438/307; 438/656; 438/763
[58] Field of Search ..................................... 438/287, 305, 438/306, 307, 655, 656, 762, 763

[56] References Cited

U.S. PATENT DOCUMENTS

| 5,032,535 | 7/1991 | Kamijo et al. | 438/307 |
| 5,650,344 | 7/1997 | Ito et al. | 438/287 |
| 5,668,028 | 9/1997 | Bryant | 438/287 |
| 5,776,822 | 7/1998 | Fujii et al. | 438/656 |

FOREIGN PATENT DOCUMENTS

| 61-16571 | 1/1986 | Japan . |
| 61-194779 | 8/1986 | Japan . |

OTHER PUBLICATIONS

Japanese Office Action dated Sep. 11, 1998 with English language translation of Japanese Examiner's comments.
Mizuno, T., et al., "Hot–carrier injection suppression due to the nitride–oxide LDD spacer structure," *IEEE Transactions on Electron Devices*, vol. 38, No. 3, pp. 584–591, Mar. 1991.

*Primary Examiner*—Chandra Chaudhari
*Attorney, Agent, or Firm*—Whitham, Curtis & Whitham

[57] ABSTRACT

On a surface of a silicon substrate having conductivity type of p-type, a field oxide layer and a gate oxide layer to be an isolation region are formed. A gate electrode is formed via the gate oxide layer. A surface silicon oxide layer is formed on a surface of the gate electrode. An etch stop layer is formed at a region outside of the surface silicon oxide layer, which etch stop layer is formed of a material different from a material of the gate oxide layer. Also, on the upper surface of the etch stop layer, an interlayer insulation layer is formed. Then, on the surface of the silicon substrate in the vicinity of the end of the gate electrode, an $n^-$-diffusion layer is formed. In a region outside of the $n^-$-diffusion layer, an $n^+$-diffusion layer is formed. On the other hand, between the upper surface of the $n^-$-diffusion layer and the $n^+$-diffusion layer and the lower end of the etch stop layer, a bottom silicon oxide layer having greater layer thickness than the gate oxide layer is formed. A wiring and the $n^+$-diffusion layer are connected each other via the contact hole formed in the interlayer insulation layer.

10 Claims, 9 Drawing Sheets

FIG. IA
(PRIOR ART)
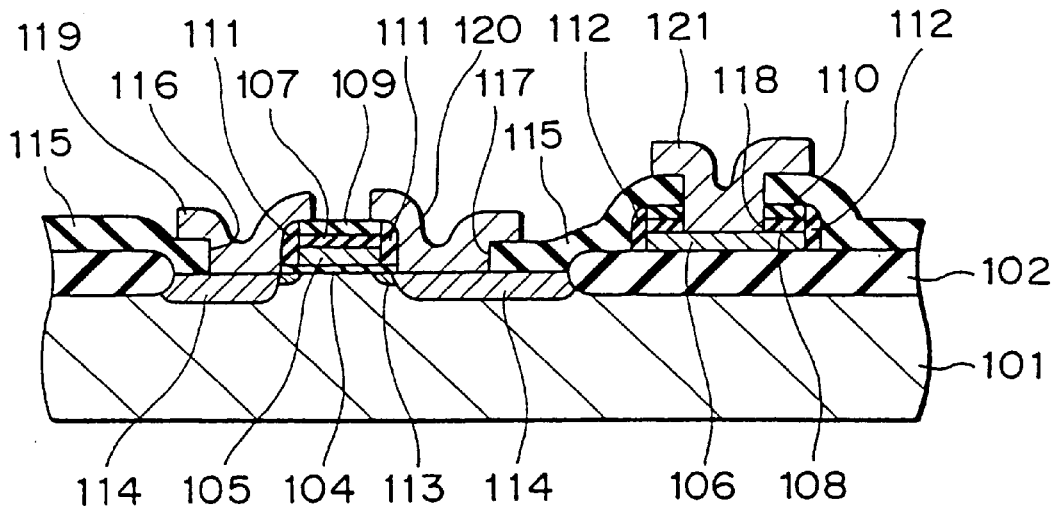
FIG. IB
(PRIOR ART)
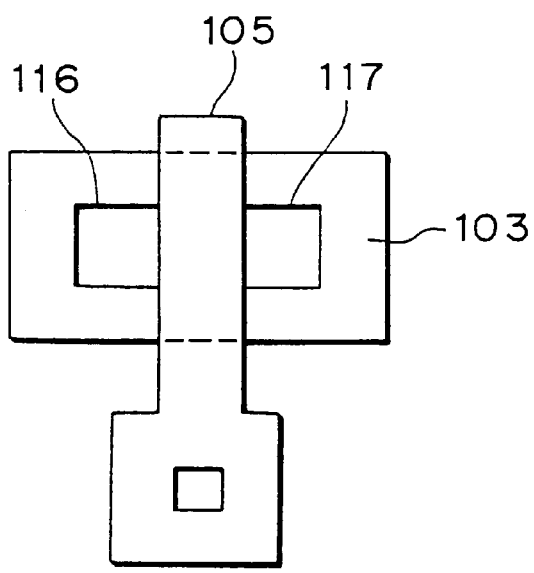

METHOD OF MAKING A SELF-ALIGNING TYPE CONTACT HOLE FOR A SEMICONDUCTOR DEVICE

CROSS REFERENCE TO RELATED APPLICATION

This application is a divisional application of Ser. No. 08/805,564 filed Feb. 25, 1997, now U.S. Pat. No. 5,821,594.

BACKGROUND OF THE INVENTION

1. Field of the Invention

The present invention relates to a semiconductor device having an insulated gate field effect transistor having a self-align type contact hole, and a fabrication process therefor.

2. Description of the Prior Art

It has still been progressed actively for reducing size and increasing package density of semiconductor elements. In the current technology, ultra high density semiconductor devices such as 1 Gbit dynamic random access memory (GbDRAM) designed under dimensional standard of about 0.18 μm, have been developed and fabricated in experiments. Associating with increasing of package density of the semiconductor device, it has been highly demanded to make a mask alignment margin unnecessary in photolithographic process which is essential process in formation of a semiconductor element structure.

Normally, in fabrication of the semiconductor device, patterns formed of various materials, such as a metal layer, a semiconductor layer, an insulation layer and so forth, are stacked on a semiconductor substrate in a predetermined sequential order to form a semiconductor element of a fine structure. For stacking the patterns for the semiconductor element, it has been required in the photolithographic process to align a mask to a lower layer pattern formed in a preceding process and then to perform patterning an upper layer. However, in the photolithographic process, it is possible to cause offset of position between the upper pattern and the lower pattern. Therefore, it has been required to set a margin within an interval between the patterns anticipating the position offset. However, such margin can be a cause of restriction for increasing of density of the pattern.

Therefore, various technical methods have been studied in order to make the margin unnecessary (marginless structure). It is particularly important to avoid necessity of margin in formation of the contact hole. Such contact hole is frequently formed in various layer on a semiconductor substrate, a semiconductor layer or a metal layer. Therefore, it is most effective for achieving increased package density and increased integration density of the semiconductor device to avoid necessity of the margin. Among a technology for avoiding necessity of the margin, formation process of a self-align type contact hole, as one kind of self-aligning methods, is an effective method. Various studies have been made for concrete processes.

Among formation process of the self-aligning type contact hole, attention has been attracted to a method for forming the contact hole on a diffusion layer in self-alignment with a gate electrode by providing a spacer of an insulation layer in an insulated-gate field-effect transistor, such as a MOS transistor, by anisotropic etching of an insulation layer. One example of such method has been disclosed in Japanese Unexamined Patent Publication (Kokai) No. Showa 61-16571.

FIGS. 1A and 1B are illustrations showing a fabrication process of a MOS transistor having above-mentioned known self-align type contact holes, wherein FIG. 1A is a section showing a structure of the semiconductor device and FIG. 1B is a plan view of the semiconductor device.

As shown in FIG. 1A, after formation of a field oxide layer 102 by selectively oxidizing a surface of a silicon substrate 101, a gate oxide layer 104 is formed on the surface of the silicon substrate 101 in a region where the field oxide layer 102 is not formed. Furthermore, an $n^+$-polysilicon layer doped with n-type impurity is deposited over the entire surface. Next, after formation of a silicon oxide layer having thickness of approximately 50 nm by oxidizing a surface of the $n^+$-polysilicon layer, a silicon nitride layer is deposited in a thickness of approximately 100 nm over the entire surface. Then, a resist pattern defining a gate electrode region and a wiring region is formed. With taking this resist pattern as a mask, etching is performed in the sequential order of the silicon nitride layer, the silicon oxide layer and $n^+$-polysilicon layer. Thus, a gate electrode consisting of a gate polysilicon layer 105, a silicon oxide layer 107 and a silicon nitride layer 109 are formed by patterning those three layers. On the other hand, a wiring consisting of a wiring polysilicon layer 106, a silicon oxide layer 108 and a silicon nitride layer 110 are formed by patterning those layers. Subsequently, low concentration impurity is injected in the silicon substrate 101 using the gate electrode and the field oxide layer 102 as a mask by ion implantation.

Next, after removal of the resist pattern, a silicon nitride layer having thickness of approximately 100 nm is deposited over the entire surface. Thereafter, etching is performed by way of reactive ion etching (RIE) method with leaving a side silicon nitride layer 111 on the side surface of the gate polysilicon layer 105, the silicon oxide layer 107 and the silicon nitride layer 109, and a side nitride silicon layer 112 on the side surface of the wiring polysilicon layer 106, the silicon oxide layer 108 and the silicon nitride layer 110. Then, high concentration impurity is injected by way of ion implantation method for forming a source-drain region. The ion implanted region thus obtained has low impurity concentration in the region below the side silicon nitride layer 111, and has high impurity concentration in the region outside of the low impurity concentration region.

Next, an interlayer insulation layer 115 formed of a PSG layer (phosphosilicate glass layer), for example, is deposited over the entire surface. Thereafter, under oxygen or nitrogen atmosphere, heat treatment is performed at about 1000° C. for about 30 minutes. By this heat treatment, the region where ion is implanted is activated to form a source-drain region of LDD structure constituted of a low concentration diffusion region 113 and a high concentration diffusion region 114.

Next, a resist pattern for a contact hole above the diffusion region and a contact hole above the wiring are formed. With taking the resist pattern as a mask, etching is performed for the interlayer insulation layer 115 to form contact holes 116 and 117 on the diffusion region and a contact hole 118 of the wiring layer. At this time, the contact holes 116 and 117 are formed in self-align manner with taking the silicon nitride layer 109 and the side silicon nitride layer 111 as a mask. Next, by forming a resist pattern having greater size than the contact hole in the wiring region, the silicon oxide layer and the silicon nitride layer are etched on the wiring polysilicon layer 106. Then, metal layer patterns 119, 120 and 121 are formed. As a result, as shown in the plan view of FIG. 1B, even when the contact holes 116 and 117 formed on the active region 103 are designed to contact with the gate polysilicon layer 105, the side silicon nitride layer 111 becomes the insulation layer. Therefore, the gate polysilicon layer 105 and the metal layer patterns 119 and 120 will never be electrically shorted.

With such prior art, by covering the upper surface and the side surface of the gate electrode by the silicon nitride layer, the contact hole formed in the diffusion layer to be the source-drain region has no margin relative to the gate electrode to form in self-align manner.

However, in the prior art, thickness of a silicon oxide layer disposed between the lower surface of the side silicon nitride layer 111 formed on the side surface of the gate polysilicon layer 105 and an upper surface of the low concentration diffusion region 113 formed at the surface of the silicon substrate 101, is the same extent to the gate oxide layer 104 or lesser. For example, in the semiconductor device, employing a fine MOS transistor subsequent to 1 GbDRAM which has gate length less than or equal to 0.2 μm, layer thickness of the gate oxide layer becomes less than or equal to approximately 6 nm. Therefore, the layer thickness of the silicon oxide layer below the silicon nitride layer becomes quite thin. As a result, the MOS transistor employing the prior art is degraded in reliability of characteristics, particularly in reliability against hot carrier stress.

SUMMARY OF THE INVENTION

It is therefore an object of the present invention to provide a semiconductor device constructed with a super fine and highly reliable MOS transistor having a self-align type contact hole, and a fabrication process therefor.

According to one aspect of the invention, a semiconductor device comprises an insulated gate field effect transistor including a one conductivity type semiconductor substrate, a gate insulation layer formed with a first oxide layer formed on a surface of the semiconductor substrate and source-drain regions with a diffusion layer of the other conductivity type formed at the surface of the semiconductor substrate. A protective insulation layer is formed on an upper surface and a side surface of a gate electrode of the insulated-gate field-effective transistor. The protective insulation layer is formed of a material different from a material of the first oxide layer. A second oxide layer is formed between the protective insulation layer and the diffusion layer. The second oxide layer has thickness greater than the gate insulation layer. A contact hole is provided above the diffusion layer and the protective insulation layer is positioned at a side surface of the contact hole.

In the semiconductor device, the protective insulation layer may be a layer selected from a group consisted of a silicon nitride layer, a silicon nitric oxide layer, an aluminum nitride layer and an alumina layer.

On the other hand, in the semiconductor device, the protective insulation layer may be a composite layer consisted of a third oxide layer and a nitride layer formed and stacked on the surface of the third oxide layer.

On the other hand, in the semiconductor device, the insulated-gate field-effect transistor may be one of a transistor selected from a group consisted of an n-channel type MOS transistor, a p-channel type MOS transistors, a CMOS and a BiCMOS.

Also, in the semiconductor device, the insulated-gate field-effective transistor may have a gate electrode formed with a semiconductor layer and a refractory metal silicide layer.

Furthermore, in the semiconductor device, the refractory metal silicide may be a layer formed of a material selected from a group consisted of tungsten silicide, molybdenum silicide, titanium silicide, cobalt silicide and nickel silicide.

The semiconductor device according to the present invention, the diffusion layer may have a LDD structure.

The semiconductor device may further comprise an interlayer insulation layer formed on the surface of the protective insulation layer and formed of a material different from a material of the protective insulation layer and a wiring connected to the diffusion layer and the interlayer insulation layer via the contact hole.

In the semiconductor device, the interlayer insulation layer may be a boron-doped phospho-silicate glass layer. Also, the wiring may be formed of an aluminum alloy.

According to another aspect of the invention, a fabrication process of a semiconductor device comprises a step of forming a gate insulation layer on a surface of one conductivity type semiconductor substrate. Then, a second step of forming a conductive layer and a first insulation layer having high thermal oxidation resistance are formed on a surface of the gate insulation layer. Thereafter, a gate electrode of the conductive layer is formed by patterning the conductive layer and the first insulation layer. A second insulation layer having high thermal oxidation resistance is formed on the side wall of the conductive layer and the first insulation layer. Then, thermal oxidation is performed for the surface of the semiconductor substrate with taking the first and second insulation layers as a mask for thermal oxidation. In this case, an oxide layer having layer thickness thicker than layer thickness of the gate insulation layer are formed between the semiconductor substrate and the second insulation layer. Thereafter, a third insulation layer having high thermal oxidation resistance is deposited over the entire surface. Anisotropic dry etching is performed for the third insulation layer and the oxide layer. A protective insulation layer covers a side surface of the second insulation layer and a surface of the oxide layer.

The fabrication process of a semiconductor device may comprise a step of forming an interlayer insulation layer with a material different from a material of the protective insulation layer, after said anisotropic dry etching step. A contact hole may be formed on the surface of the diffusion layer by dry etching the interlayer insulation layer in self-alignment to the protective layer.

On the other hand, the anisotropic dry etching of the third insulation layer and the oxide layer may be a dry etching employing a $CF_4+CHF_3$ mixture gas.

The dry etching of the interlayer insulation layer may be a dry etching employing a $CF_4+CH_2F_2$ mixture gas.

The fabrication process of a semiconductor device may comprise a step of performing ion implantation of phosphorus in a dose amount of $2\times10^{13}$ $cm^{-2}$ with an energy of 30 keV, for example, with taking the first insulative layer and the second insulative layer as a mask. This step is performed between said thermal oxidation step and said third insulation layer forming step. Ion implantation of arsenic may be performed in a dose amount of $3\times10^{15}$ $cm^{-2}$ with an energy of 50 keV, for example, with taking the first insulation layer, the second insulation layer and the third insulation layer as a mask, between said third insulation layer forming step and said anisotropic dry etching step.

According to a still further aspect of the invention, a fabrication process of a semiconductor device comprises a step of forming a gate insulation layer on a surface of a one conductivity type semiconductor substrate. Then, a conductive layer is formed on a surface of the gate insulation layer. Thereafter, a refractory metal silicide layer is formed on the conductive layer by a sputtering method. A first oxide layer and a first insulation layer having high thermal oxide resistance is formed in sequential order on the refractory metal silicide layer. Then, a gate electrode consisted with the conductive layer and the refractory metal silicide layer is formed by patterning the conductive layer, the refractory metal silicide layer, the first oxide layer and the first insulation layer. Thereafter, a second oxide layer is formed on the upper surface of the first insulation layer and the side surfaces of the conductive layer, the refractory metal silicide layer, the first oxide layer and the first insulation layer. A second insulation layer having high thermal oxidation resistance is formed on the side wall of the second oxide layer, for forming an oxide region having greater thickness than that of the gate insulation layer between the semiconductor substrate and the second insulation layer. Then, an anisotropic dry etching is performed for the second oxide layer. A slit is formed between the first insulation layer and the second insulation layer. Thereafter, a third insulation layer is deposited over the entire surface and etched back for leaving itself in the slit and on the side surface of the second insulation layer.

In a fabrication process of a semiconductor device may comprise a step of forming an interlayer insulation layer with a material different from a material of the protective insulation layer, after said anisotropic dry etching step. A contact hole may be formed on the surface of the diffusion layer by dry etching the interlayer insulation layer in self-alignment to the protective layer.

In a fabrication process of a semiconductor device, the anisotropic dry etching may be a dry etching employing a $CF_4+CHF_3$ mixture gas.

In a fabrication process of a semiconductor device, the dry etching of the interlayer insulation layer may a dry etching employing a $CF_4+CH_2F_2$ mixture gas.

The fabrication process of a semiconductor device may comprise a step of performing ion implantation of phosphorus in a dose amount of $2 \times 10^{13}$ cm$^{-2}$ with an energy of 30 keV, for example, with taking the first insulative layer and the second insulative layer as a mask. This step is performed between said second oxide layer forming step and said second insulation layer depositing step. Ion implantation of arsenic may be performed in a dose amount of $3 \times 10^{15}$ cm$^{-2}$ with an energy of 50 keV, for example, with taking the first insulation layer, the second insulation layer and the third insulation layer as a mask, between said second insulation layer depositing step and said anisotropic dry etching step. Then, a diffusion layer having the other conductivity type may be formed by performing annealing at 850° C. for 30 minutes.

In the present invention, since the upper surface and the side surface of the gate electrode are completely covered with the etch stop layer, the contact hole for connecting the n$^+$-diffusion layer and the wiring can be formed in self-align manner. Thus, down-sizing of the semiconductor element is facilitated. Also, since the silicon oxide layer below the etch stop layer is formed to be thicker than the gate oxide layer, hot carrier resistance becomes high to improve long period reliability. Then, a super fine and reliable MOS transistor having self-align type contact hole can be formed. Furthermore, high speed operation of the semiconductor device having the MOS transistor becomes possible.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 1A is a section showing a structure of the conventional semiconductor device;

FIG. 1B is a plan view of the conventional semiconductor device of FIG. 1A;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 2:
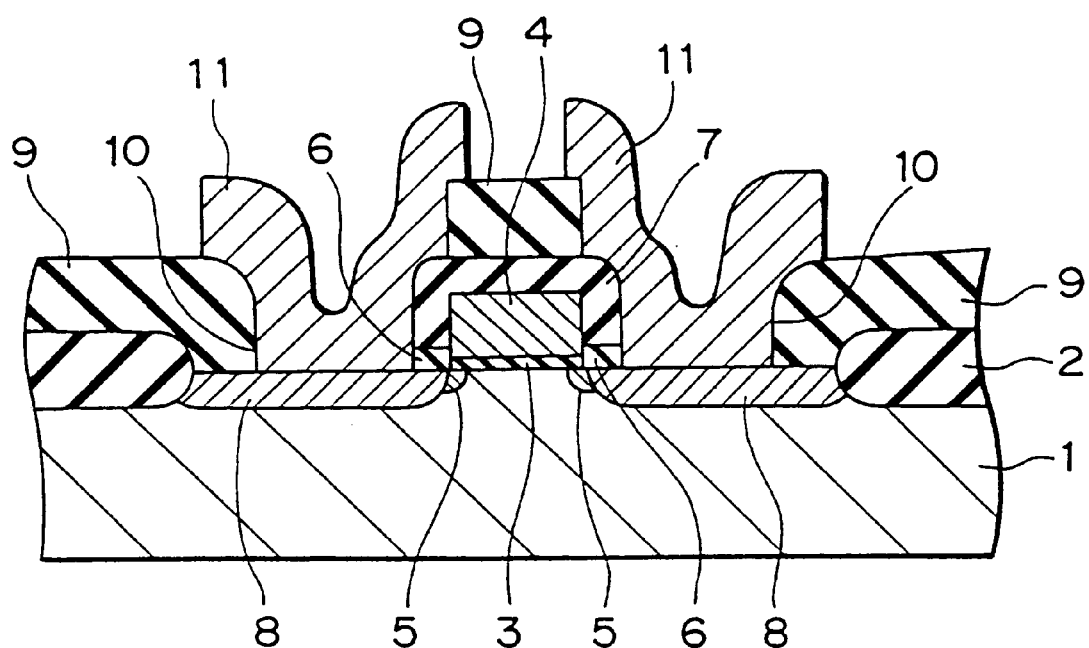
FIG. 2 is a section showing a structure of the first embodiment of a semiconductor device according to the present invention.

FIG. 2 is a section showing a structure of the first embodiment of a semiconductor device according to the present invention.

On a surface of a silicon substrate 1 having conductivity type of p-type, a field oxide layer 2 to be an isolation layer and a gate oxide layer 3, are formed. A gate electrode 4 is formed on the gate oxide layer 3. On an upper surface and a side surface of the gate electrode 4, a protective insulation layer, namely an etch stop layer 7, of a material different from a material of the gate oxide layer 3, is formed for protecting the gate electrode 4. Also, on an upper surface of the etch stop layer 7, an interlayer insulation layer 9 is formed. At the surface of the silicon substrate 1 in the vicinity of the end of the gate electrode 4, an n$^-$-diffusion layer 5 is formed. In a region outside of the n$^-$-diffusion layer 5, an n$^+$-diffusion layer 8 is formed. Between the upper surface of the n$^-$-diffusion layer 5 and the n$^+$-diffusion layer 8 and a lower end of the etch stop layer 7, a bottom silicon oxide layer 6 thicker than the gate oxide layer 3 is formed. A wiring 11 is connected to the n$^+$-diffusion layer 8 via a contact hole 10 formed in the interlayer insulation layer 9.

Figure 3A:
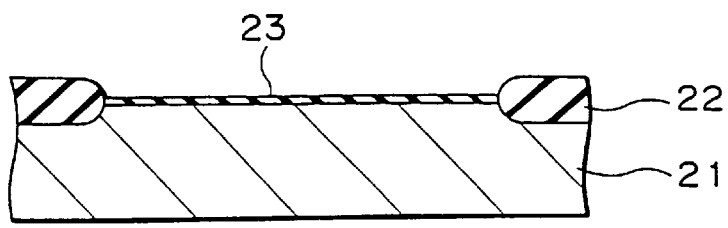
FIGS. 3A to 3N are sections showing process steps in sequential order of the first embodiment of a semiconductor device fabrication process according to the present invention.

Next, a fabrication process of the first embodiment of the semiconductor device according to the present invention will be described with reference to FIGS. 3A to 3N. FIGS. 3A to 3N are sections showing process steps in sequential order of the first embodiment of a semiconductor device fabrication process according to the present invention.

At first, as shown in FIG. 3A, on a surface of a p-type silicon substrate 21, a field oxide layer 22 having thickness of 400 nm, for example, is selectively formed by a normal selective oxidation method (LOCOS, for example). Thereafter, the entire surface is subject to thermal oxidation at 750° C. under water vapor atmosphere to form a gate oxide layer 23 having thickness of 6 nm, for example, on a surface of the silicon substrate 21 in a region where the field oxide layer 22 is not formed.

Figure 3B:
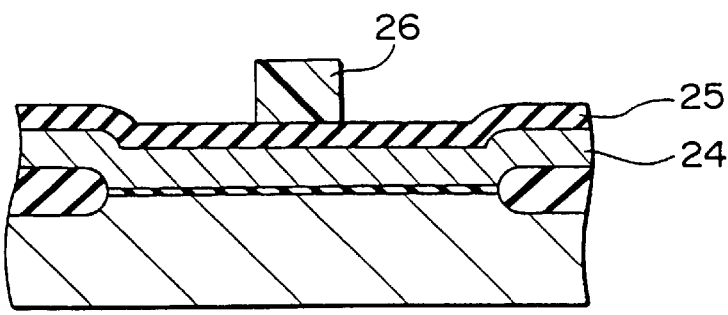

Next, as shown in FIG. 3B, an n-type polysilicon layer 24 is deposited over the entire surface by chemical vapor deposition (CVD) method, in thickness of 200 nm, for example. Also, a first silicon nitride layer 25 is deposited by CVD method in thickness of 200 nm, for example. Subsequently, a resist pattern 26 is formed in a region where a gate electrode should be formed.

Figure 3C:
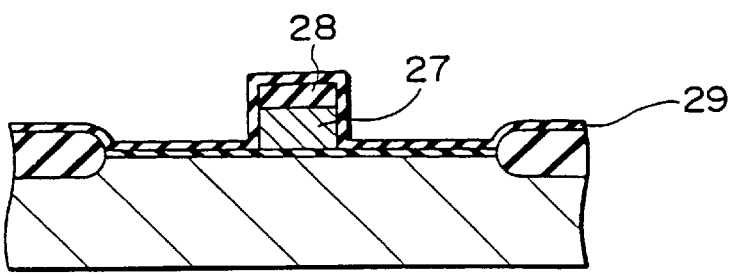

Then, as shown in FIG. 3C, with taking the resist pattern 26 as a mask, the first silicon nitride layer 25 and the n-type polysilicon layer 24 are etched by RIE method. Thereafter, the resist pattern 26 is removed. Thus, a gate electrode 27 and an upper silicon nitride layer 28 are formed. Subsequently, a second silicon nitride layer 29 having thickness of 10 nm, for example, is deposited by CVD method over the entire surface.

Figure 3D:
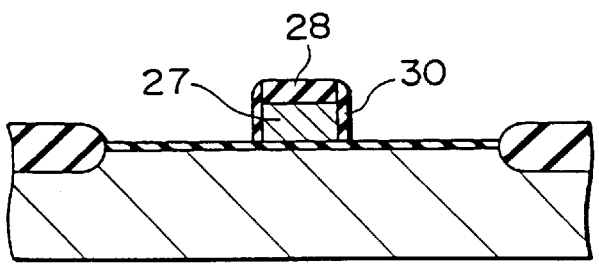

Next, as shown in FIG. 3D, by etching back the second silicon nitride 29, a first side silicon nitride layer 30 is formed on the side surfaces of the gate electrode 27 and the upper silicon nitride layer 28.

Figure 3E:
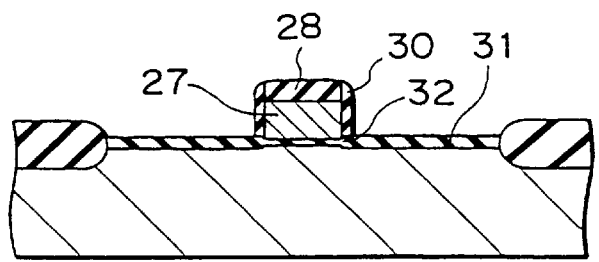

Subsequently, as shown in FIG. 3E, by thermal oxidation at 750° C. under water vapor atmosphere, a silicon oxide layer 31 having layer thickness of 25 nm, for example, is formed on the exposed surface of the gate oxide layer 23. At this time, the upper surface and the side surface of the gate electrode 27 formed with the n-type polysilicon layer are not oxidized since the upper silicon nitride layer 28 and the first side silicon nitride layer 30 serve for preventing oxidation. On the other hand, a region on the surface of the silicon substrate 21 and below the first side silicone nitride layer 30, is oxidized to laterally penetrate from the surface of the gate oxide layer 23 as in bird's beak shape by LOCOS method since the layer thickness of the first silicon nitride layer 30 is thin, as 10 nm, to form a bottom silicon oxide layer 32 having thickness greater than or equal to 20 nm.

Figure 3F:
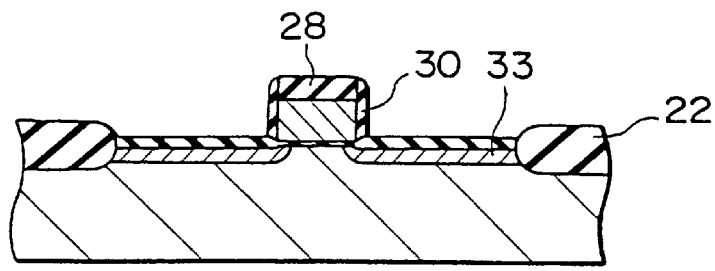

Next, as shown in FIG. 3F, a low concentration phosphorus ion implanted layer 33 is formed at the surface of the silicon substrate 21 by implanting phosphorus ion in dose amount of $2 \times 10^{13}$ cm$^{-2}$ with an energy of 30 keV, for example, by performing ion implantation over the entire surface with taking the field oxide layer 22, the upper silicon nitride layer 28 and the first side silicon nitride layer 30 as mask.

Figure 3G:
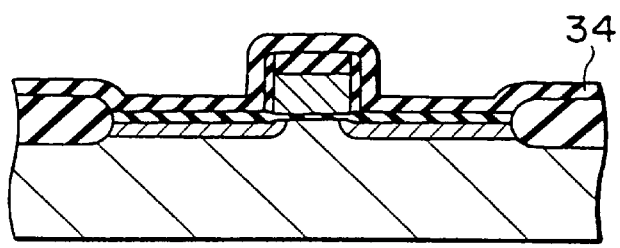

Then, as shown in FIG. 3G, a third silicon nitride layer 34 having thickness of 150 nm is deposited over the entire surface by CVD method.

Figure 3H:
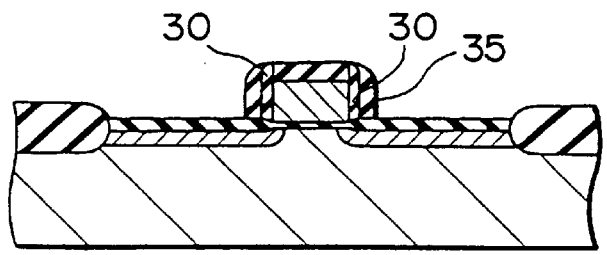

Subsequently, as shown in FIG. 3H, by etching back the third silicon layer 34, a second side silicon nitride layer 35 is formed on the surface of the first side silicon nitride layer 30.

Figure 3I:
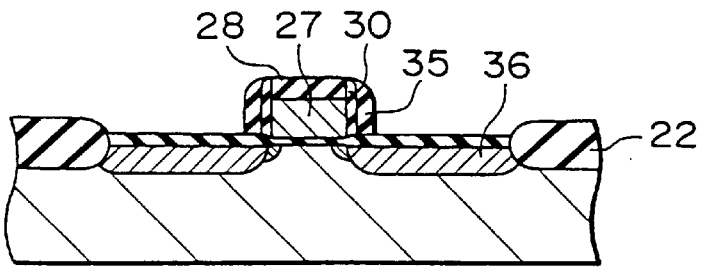

Next, as shown in FIG. 3I, a high concentration arsenic ion implantation layer 36 is formed at the surface of the silicon substrate 21 by implanting arsenic ion at dose amount of $3 \times 10^{15}$ cm$^{-2}$ with an energy of 50 keV, for example, by ion implantation over the entire surface with taking the field oxide layer 22, the upper silicon nitride layer 28, the first side silicon nitride layer 30 and the second side silicon nitride layer 35 as a mask.

Figure 3J:
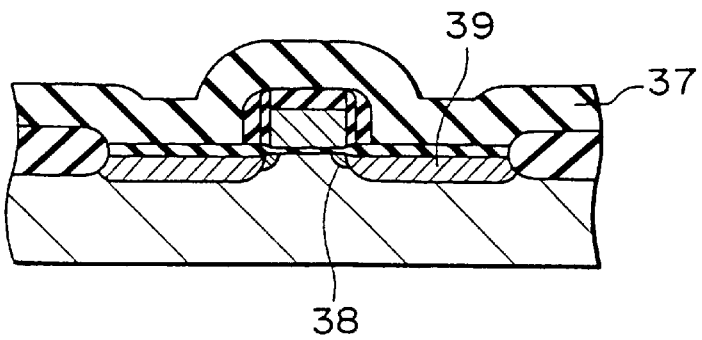

Thereafter, as shown in FIG. 3J, a BPSG layer 37 (boron-doped phospho-silicate glass layer) having thickness of 400 nm, for example, is deposited by CVD over the entire surface. Subsequently, annealing is performed at 850° C. for 30 minutes. Thereby, the low concentration phosphorus ion implanted layer 33 and the high concentration arsenic ion implanted layer 36 are activated to form an n$^-$-diffusion layer 38 and an n$^+$-diffusion layer 39 are formed, respectively.

Figure 3K:
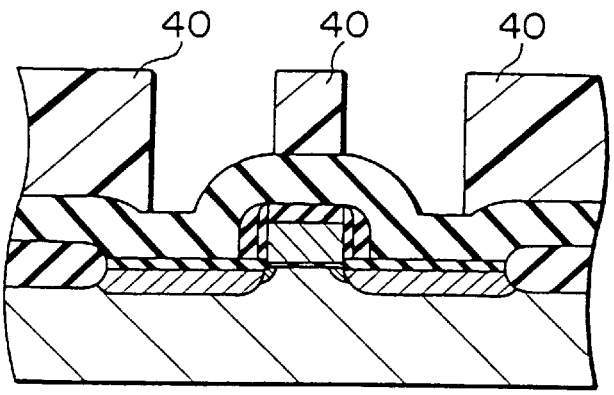

Next, as shown in FIG. 3K, a resist pattern 40 to be a mask for forming a contact hole is formed. The resist pattern 40 is also opened above a part of a gate electrode region formed with the gate electrode 27, the upper silicon nitride layer 28, the first side silicon nitride layer 30 and the second side silicon nitride layer 35.

Figure 3L:
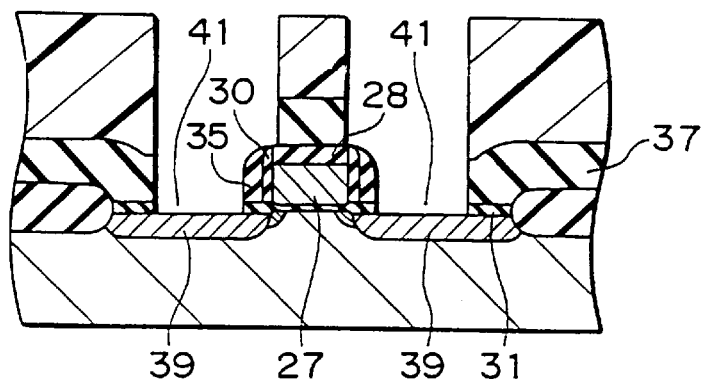

Then, as shown in FIG. 3L, with taking the resist pattern 40 as a mask, etching is performed for the BPSG layer 37 as an interlayer insulation layer and the silicon oxide layer 31 by RIE method to open a contact hole 41 reaching the n$^+$-diffusion layer 39. When selective etching is performed employing a $CF_4+CH_2F_2$ mixture gas upon forming the contact hole 41, selection ratio of etching of the BPSG layer 37 and the silicon oxide layer 31 relative to the first side silicon nitride layer 30, the second side silicon nitride layer 35 as the etch stop layer and the silicon substrate 21 becomes greater than or equal to 30 times. Therefore, in the gate electrode region above which the resist pattern 40 is opened, the upper silicon nitride layer 28, the first side silicon nitride layer 30 and the second side silicon nitride layer 35 serve as etch stop layers. Thus, the contact hole 41 never reaches the gate electrode 27. Also, the silicon substrate 21 is never etched.

Figure 3M:
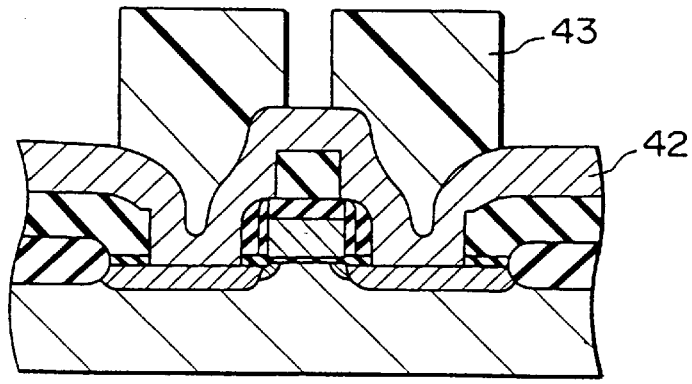
Figure 3N:
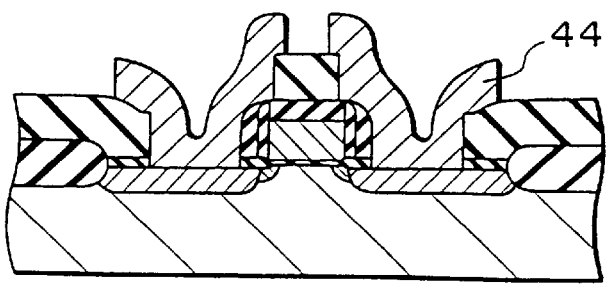

Next, as shown in FIG. 3M, the resist pattern 40 is removed. Thereafter, an aluminum alloy layer 42 having thickness of 500 nm, for example, is deposited by way of sputtering over entire surface and a resist pattern 43 for defining a wiring is formed.

In the next step, as shown in FIG. 3N, with taking the resist pattern 43 as a mask, the aluminum alloy layer 42 is etched to form a wiring 44. Thereafter, the resist pattern 43 is removed. Thus, the first embodiment of the semiconductor device according to the invention including an n-channel type MOS transistor can be fabricated.

In the first embodiment as set forth above, in order to form the self-align type contact hole above the diffusion layer of the MOS transistor, the etch stop layer is formed with the silicon nitride layer on the surface of the gate electrode of the MOS transistor. In this case, normally, large number of trap centers for trapping electron and hole are present in the etch stop layer. However, in the shown embodiment, the silicon oxide layer 6 having layer thickness thicker than the layer thickness of the gate insulation layer 3 is formed between the lower surface of the etch stop layer and the upper surface of the diffusion layer. Therefore, hot carrier generated during operation of the MOS transistor is blocked by the thick silicon oxide layer 6 and thus cannot reach the etch stop layer. Therefore, the hot carrier will never be trapped in the trap center. In this way, long period reliability against hot carrier stress can be significantly improved.

It should be noted that, in the first embodiment of the fabrication process, the silicon oxide layer below the etch stop layer is formed by way of thermal oxidation. However, the gate electrode will never be oxidized and thus increasing of resistance of the gate electrode is prevented.

Figure 4:
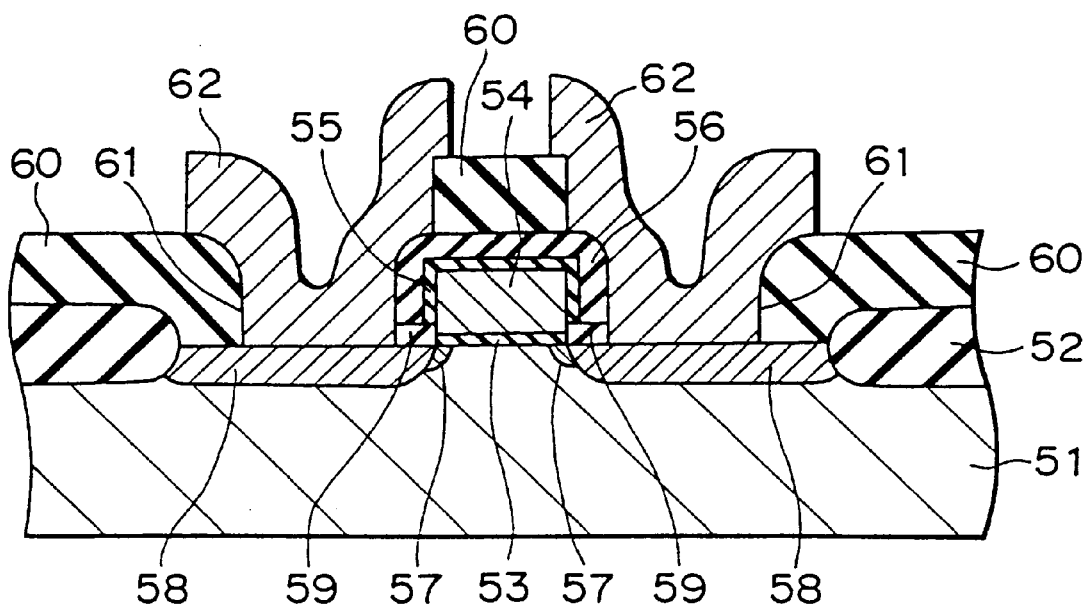
FIG. 4 is a section showing a structure of the second embodiment of a semiconductor device according to the present invention.

Next, the structure of the second embodiment of the semiconductor device according to the present invention will be discussed with reference to FIG. 4. FIG. 4 is a section showing a structure of the second embodiment of a semiconductor device according to the present invention.

On a surface of a silicon substrate 51 having conductivity type of p-type, a field oxide layer 52 to be an isolation layer and a gate oxide layer 53 are formed. A gate electrode 54 is formed via the gate oxide layer 53. On a surface the gate electrode 54, a surface silicon oxide layer 55 is formed. An etch stop layer 56 formed of a material different from a material of the gate oxide layer 53 is formed in a region outside of the surface silicon oxide layer 55. Also, on an upper surface of the etch stop layer 56, an interlayer insulation layer 60 is formed. At the surface of the silicon substrate 51 in the vicinity of the end of the gate electrode 54, an n⁻-diffusion layer 57 is formed. In a region outside of the n⁻-diffusion layer 57, an n⁺-diffusion layer 58 is formed. Between the upper surface of the n⁻-diffusion layer 57 and the n⁺-diffusion layer 58 and a lower end of the etch stop layer 56 and the silicone oxide layer 55, a bottom silicon oxide layer 59 thicker than the gate oxide layer 53 is formed. Then, a contact hole 61 is formed in the interlayer insulation layer 60, and a wiring 62 is formed so as to be connected to the n⁺-diffusion layer 8 via the contact hole 61.

Figure 5A:
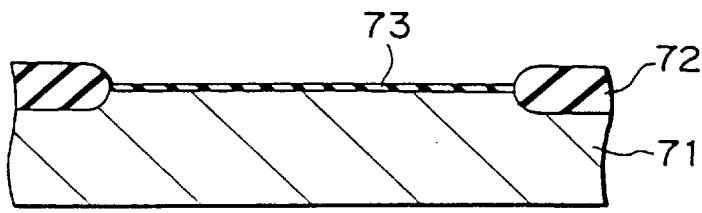
FIGS. 5A to 5N are sections showing process steps in sequential order of the second embodiment of a semiconductor device fabrication process according to the present invention.

Next, a fabrication process of the second embodiment of the semiconductor device according to the present invention will be described with reference to FIGS. 5A to 5N. FIGS. 5A to 5N are sections showing process steps in sequential order of the second embodiment of a semiconductor device fabrication process according to the present invention.

At first, as shown in FIG. 5A, on a surface of a p-type silicon substrate 71, a field oxide layer 72 having thickness of 400 nm, for example, is selectively formed by normal selective oxidation method (LOCOS, for example). Thereafter, the entire surface is subject to thermal oxidation at 750° C. under water vapor atmosphere to form a gate oxide layer 73 having thickness of 6 nm, for example, on the surface of the silicon substrate 71 in a region other than a region where the field oxide layer 72 is formed.

Figure 5B:
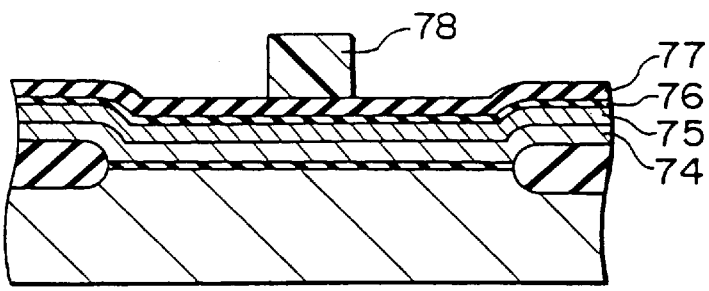

Next, as shown in FIG. 5B, an n-type polysilicon layer 74 is deposited over the entire surface by chemical vapor deposition (CVD) method, in thickness of 100 nm, for example, and a tungsten silicide layer 75 having layer thickness of 100 nm is deposited by way of sputtering method. Also, a first silicon oxide layer 76 is deposited by CVD method in thickness of 20 nm, for example, at 400° C. Also, a first silicon nitride layer 77 having layer thickness of 200 nm, for example, is deposited by CVD method with setting the temperature at 800° C. Subsequently, a resist pattern 78 is formed in a region where a gate electrode should be formed. Here, if the first silicon nitride layer 77 is deposited immediately after forming the tungsten silicide layer 75 without forming the first silicon oxide layer 76, the tungsten silicide layer 75 should cause chemical reaction to produce a tungsten nitride layer to significantly increase resistance, since the temperature for depositing the first silicon nitride layer 77 is as high as about 800° C. According to the shown embodiment, since the first silicon oxide layer 76 is previously formed on the surface of the tungsten silicide layer 75, the chemical reaction set forth above can be successfully prevented.

Figure 5C:
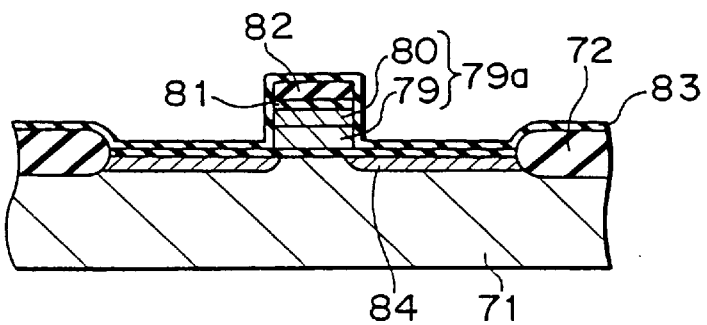

Then, as shown in FIG. 5C, with taking the resist pattern 78 as a mask, the first silicon nitride layer 77, the first silicon oxide layer 76, the tungsten silicide layer 75 and the n-type polysilicon layer 74 are etched by RIE method. Thereafter, the resist pattern 78 is removed. Thus, a gate electrode 79a constituted of an n-type polysilicon layer 79 and a tungsten silicide layer 80, an upper silicon oxide layer 81 and an upper silicon nitride layer 82 are formed. Subsequently, a second silicon oxide layer 83 having thickness of 20 nm, for example is deposited by CVD method at 400° C. over the entire surface. Then, a low concentration phosphorus ion implanted layer 84 is formed at the surface of the silicon substrate 71 by implanting phosphorus in dose amount of $2 \times 10^{13}$ cm$^{-2}$ with an energy of 30 keV, for example, with taking the field oxide layer 72, the upper silicon oxide layer 81 and the upper surface silicon nitride layer 82 as a mask, by ion implantation over the entire surface.

Figure 5D:
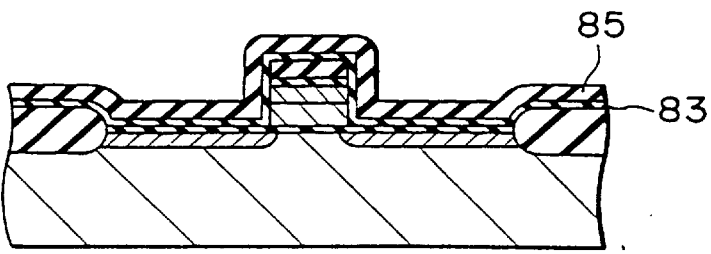

Next, as shown in FIG. 5D, a second silicon nitride layer having layer thickness of 150 nm is deposited over the entire surface by CVD method with setting a temperature about 800° C. Here, if the second silicon nitride layer 85 is deposited without depositing the second silicon oxide layer 83, similarly to the case where the first silicon nitride layer 77 is deposited without depositing the first silicon oxide layer 76, chemical reaction should be caused in the tungsten silicide layer 80 to cause increasing of resistance, since the temperature for depositing the second silicon nitride layer 85 is high. Therefore, before depositing the second silicon nitride layer 85 on the side surface of the tungsten silicide layer 80 constituting the gate electrode, the second silicon oxide layer 83 is formed for covering the tungsten silicide layer 80. Thus, occurrence of chemical reaction in the tungsten silicide layer 80 can be successfully avoided.

Figure 5E:
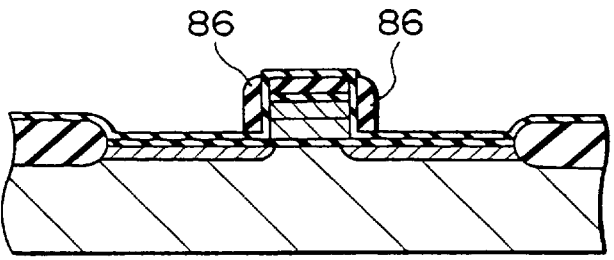

Subsequently, as shown in FIG. 5E, by etching back the second silicon nitride layer 85, a first side silicon nitride layer 86 is formed on the side surface of the gate electrode 79a.

Figure 5F:
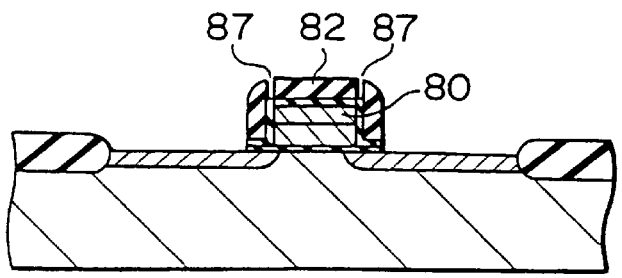

Then, as shown in FIG. 5F, by etching back the second silicon nitride layer 83 employing CF$_4$+CHF$_3$ mixture gas, the second silicon oxide layer 83 and the gate oxide layer 73 are etched. At this time, the second silicon oxide layer 83 on the upper surface and the side surface of the upper silicon nitride layer 82 are etched to form a slit 87. The process period of this etching back process is desirably double to five times of a period required for removing the second silicon oxide layer 83 deposited on the upper surface of the upper silicon nitride layer 82. If the process period is shorter than double of the period required for removing the second silicon oxide layer 83, it is possible that the slit 87 with sufficient depth cannot be formed. On the other hand, if the process period is longer than five times of the period required for removing the second silicon oxide layer 83, the slit 87 may reach the tungsten silicide layer 80. Accordingly, the process period in the etching back process is desired to be double to five times of the period required for removing the second silicon oxide layer 83 deposited on the upper surface of the upper silicon nitride layer 82.

Figure 5G:
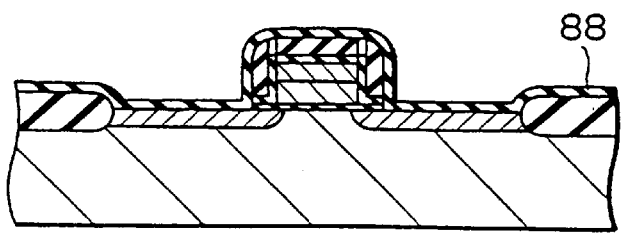

Then, as shown in FIG. 5G, a third silicon nitride layer 88 having layer thickness of 10 nm, for example, is deposited over the entire surface by way of CVD method. Thus, the third silicon nitride layer 88 is buried within the slit 87.

Figure 5H:
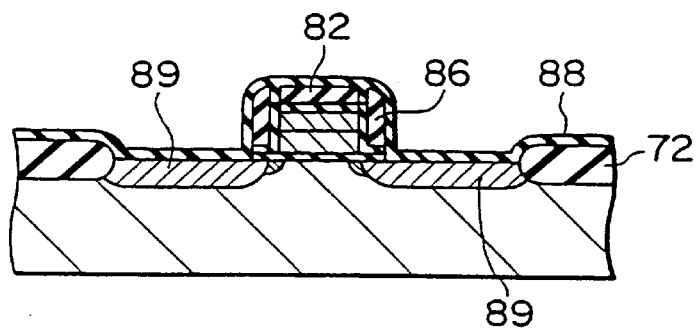

Next, as shown in FIG. 5H, a high concentration arsenic ion implantation layer 89 is formed at the surface of the silicon substrate 71 by implanting arsenic ion at dose amount of $3 \times 10^{15}$ cm$^{-2}$ by an energy of 50 keV, for example, with taking the field oxide layer 72, the upper silicon oxide layer 82, the third silicon nitride layer 88 buried in the slit 87 and the first side silicon nitride layer 86 as a mask, by ion implantation over the entire surface.

Figure 5I:
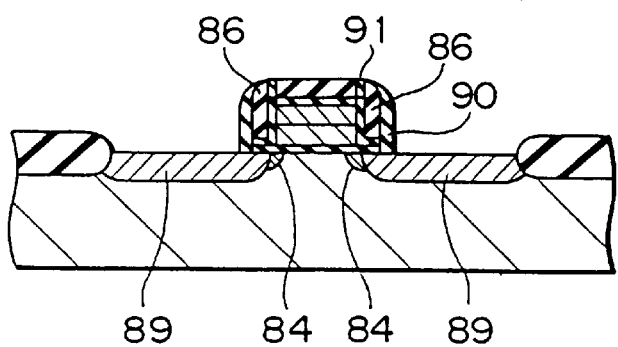

Thereafter, as shown in FIG. 5I, by etching back the third silicon nitride layer 88, a side second silicon nitride layer 90 is formed on the side surface of the first side silicon nitride layer 86. Also, a third silicon nitride layer 91 is remained in the slit 87. As a result, the upper surface and the side surface of the gate electrode 79a is covered with thin silicon oxide layers and further covered with thick silicon nitride layers completely. Then, the layer thickness of the silicon oxide layers between the lower end of the side silicon nitride layer 86 and the upper surface of the low concentration phosphorus ion implanted layer 84 can be greater than or equal to the layer thickness of the gate oxide layer 73.

Figure 5J:
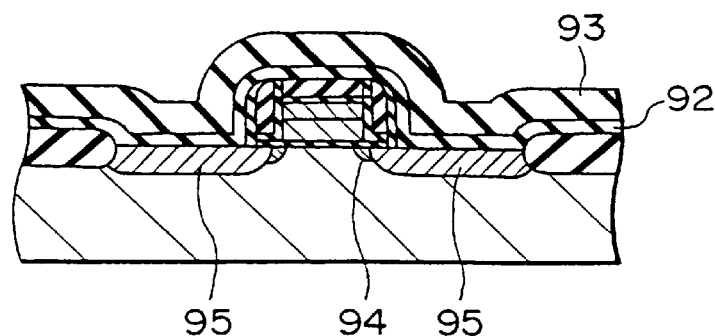

Next, as shown in FIG. 5J, a third silicon oxide layer 92 having layer thickness of 50 nm and a BPSG layer 93 having thickness of 400 nm, for example, are deposited in sequential order by CVD method over the entire surface. Subsequently, annealing is performed at 850° C. for 30 minutes. By annealing, the impurity in the low concentration phosphorus ion implanted layer 84 and the high concentration arsenic ion implantation layer 89 is activated to form an $n^-$-diffusion layer 94 and an $n^+$-diffusion layer 95 are formed, respectively.

Figure 5K:
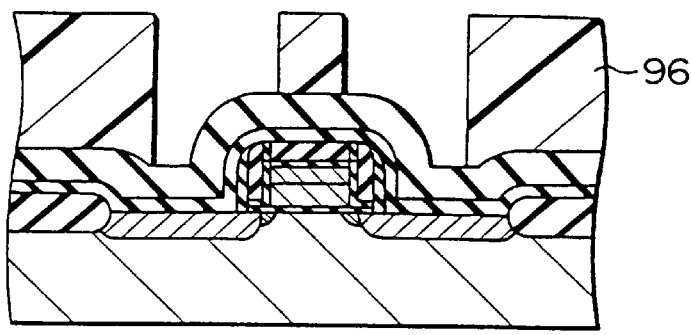

Next, as shown in FIG. 5K, a resist pattern 96 to be a mask for forming a contact hole is formed. The resist pattern 96 is also opened above a part of a gate electrode region formed with the gate electrode 79a, the upper silicon oxide layer 81, the upper silicon nitride layer 82, the first side silicon nitride layer 86, the second side silicon nitride layer 90 and the third silicon nitride layer 91.

Figure 5L:
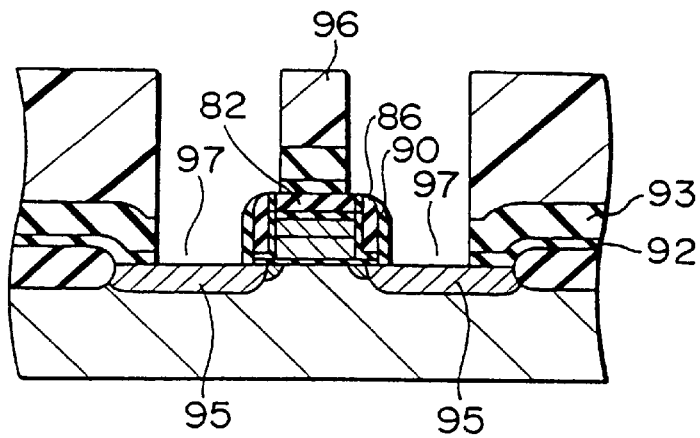

Then, as shown in FIG. 5L, with taking the resist pattern 96 as a mask, etching is performed for the BPSG layer 93 and the third silicon oxide layer 92 by RIE method to open a contact hole 41 reaching the $n^+$-diffusion layer 95. When dry etching is performed employing a $CF_4+CH_2F_2$ mixture gas upon forming the contact hole 97, in the gate electrode region above which the resist pattern 96 is opened, the upper silicon nitride layer 82, the first side silicon nitride layer 86, the second side silicon nitride layer 90 and the third silicon nitride layer 91 serve as etch stop layers. Thus, the contact hole 97 never reaches the gate electrode 79a. Also, the silicon substrate 51 is never etched.

Figure 5M:
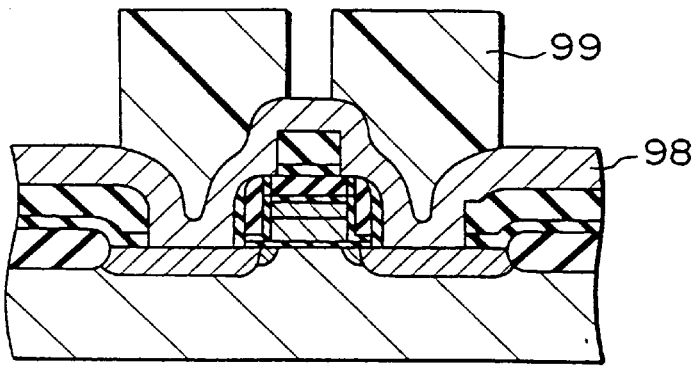
Figure 5N:
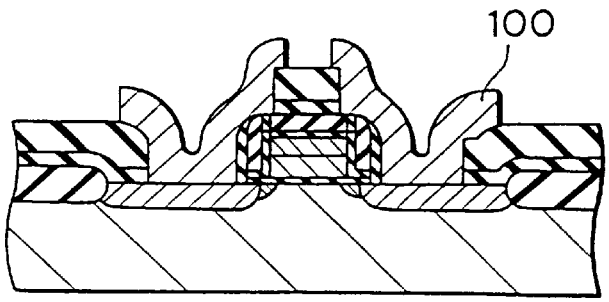

Next, as shown in FIG. 5M, the resist pattern 96 is removed. Thereafter, an aluminum alloy layer 98 having thickness of 500 nm, for example, is deposited by way of sputtering over entire surface and a resist pattern 99 for defining a wiring is formed.

In the next step, as shown in FIG. 5N, with taking the resist pattern 99 as a mask, the aluminum alloy layer 98 is etched to form a wiring 100. Thereafter, the resist pattern 99 is removed. Thus, the second embodiment of the semiconductor device according to the invention including an n-channel type MOS transistor can be fabricated.

In the second embodiment as set forth above, since a stacked layer of the n-type polysilicon layer and the refractory metal silicide layer is employed as the gate electrode, the resistance of the gate electrode can be reduced to be smaller than the case where the n-type polysilicon single layer is employed as the gate electrode. Then, since the silicon oxide layer is deposited before depositing the silicon nitride layer as the etch stop layer, chemical reaction of the refractory metal silicide layer forming the gate electrode can be prevented upon deposition of the silicon nitride layer.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

While the first and second embodiments of the present invention are illustrated in the case of the semiconductor device including the n-channel type MOS transistor, the present invention is not limited to the shown construction. For example, the present invention is applicable for the semiconductor device including a p-channel type MOS transistor, a CMOS or a BiCMOS. Also, in the first and second embodiment of the invention, the structure of the source-drain diffusion layer of the MOS transistor is explained with respect to the LDD structure, the present invention should not be limited to the shown structure.

On the other hand, in the first and second embodiments of the present invention, while the silicon nitride layer is employed as the etch stop layer, the invention is not limited to the shown construction. For example, the etch stop layer may be formed with a silicon oxidic nitride layer, an aluminum nitride layer or an alumina layer.

Also, in the second embodiment of the invention, while tungsten silicide layer on the n-type polysilicon layer is employed, the invention should not be limited to the shown construction. For instance, a molybdenum silicide layer, a titanium silicide layer, a cobalt silicide layer or a nickel silicide layer may be used in place of the tungsten silicide layer.

What is claimed is:

1. A fabrication process of a semiconductor device comprising:

a first step of forming a gate insulation layer on a surface of one conductivity type semiconductor substrate;

a second step of forming a conductive layer and a first insulation layer having high thermal oxidation resistance on a surface of said gate insulation layer;

a third step of forming a gate electrode of said conductive layer by patterning said conductive layer and said first insulation layer;

a fourth step of forming a second insulation layer having high thermal oxidation resistance on the side wall of said conductive layer and said first insulation layer;

a fifth step of performing thermal oxidation for the surface of said semiconductor substrate with taking said first and second insulation layers as a mask for thermal oxidation, in which an oxide layer having layer thickness thicker than layer thickness of said gate insulation layer are formed between said semiconductor substrate and said second insulation layer;

a sixth step of depositing a third insulation layer having high thermal oxidation resistance over the entire surface, after said fifth step; and a seventh step of performing anisotropic dry etching for said third insulation layer and said oxide layer, in which a protective insulation layer covering a side surface of said second insulation layer and a surface of said oxide layer is formed.

2. A fabrication process of a semiconductor device as set forth in claim 1, which comprises:

an eighth step of forming an interlayer insulation layer with a material different from a material of said protective insulation layer, after said seventh step; and a ninth step of forming a contact hole formed above said diffusion layer by dry etching said interlayer insulation layer in self-alignment to said protective insulation layer.

3. A fabrication process of a semiconductor device as set forth in claim 1, wherein said anisotropic dry etching is a dry etching employing a $CF_4+CHF_3$ mixture gas.

4. A fabrication process of a semiconductor device as set forth in claim 2, wherein said dry etching of the interlayer insulation layer is a dry etching employing a $CF_4+CH_2F_2$ mixture gas.

5. A fabrication process of a semiconductor device as set forth in claim 1, which comprises:
- a tenth step of performing ion implantation of phosphorus with taking said first insulative layer and said second insulative layer as a mask, said tenth step being performed between said fifth and sixth steps;
- an eleventh step of performing ion implantation of arsenic with taking said first insulation layer, said second insulation layer and said third insulation layer as a mask, said eleventh step being performed between said sixth and seventh steps; and
- a twelfth step of forming a diffusion layer having the other conductivity type by performing annealing after said eleventh step.

6. A fabrication process of a semiconductor device comprising:
- a first step of forming a gate insulation layer on a surface of one conductivity type semiconductor substrate;
- a second step of forming a conductive layer on the surface of said gate insulation layer;
- a third step of forming a refractory metal silicide layer formed on said conductive layer by a sputtering method;
- a fourth step of forming a first oxide layer and a first insulation layer having high thermal oxide resistance in sequential order on said refractory metal silicide layer;
- a fifth step of forming a gate electrode consisted with said conductive layer and said refractory metal silicide layer by patterning said conductive layer, said refractory metal silicide layer, said first oxide layer and said first insulation layer;
- a sixth step of forming a second oxide layer on the upper surface of said first insulation layer and the side surfaces of said conductive layer, said refractory metal silicide layer, said first oxide layer and said first insulation layer;
- a seventh step of forming a second insulation layer having high thermal oxidation resistance on the side wall of said second oxide layer, for forming an oxide region having greater thickness than that of said gate insulation layer between said semiconductor substrate and said second insulation layer;
- an eighth step of performing an anisotropic dry etching for said second oxide layer, in which a slit between said first insulation layer and the second insulation layer is formed; and
- a ninth step of depositing a third insulation layer over the entire surface and etching it back for leaving it in said slit and on the side surface of said second insulation layer.

7. A fabrication process of a semiconductor device as set forth in claim 6, which comprises:
- a tenth step of forming an interlayer insulation layer with a material different from a material of said protective insulation layer, after said seventh step; and
- an eleventh step of forming a contact hole formed on the surface of said diffusion layer by dry etching said interlayer insulation layer in self-alignment to said protective layer.

8. A fabrication process of a semiconductor device as set forth in claim 6, wherein said anisotropic dry etching is a dry etching employing a $CF_4+CHF_3$ mixture gas.

9. A fabrication process of a semiconductor device as set forth in claim 7, wherein said dry etching of the interlayer insulation layer is a dry etching employing a $CF_4+CH_2F_2$ mixture gas.

10. A fabrication process of a semiconductor device as set forth in claim 6, which comprises:
- a twelfth step of performing ion implantation of phosphorus with taking said first insulative layer and said second insulative layer as a mask, said twelfth step being performed between said seventh and eighth steps;
- a thirteenth step of performing ion implantation of arsenic with taking said first insulation layer and said second insulation layer as a mask, said thirteenth step being performed between said eighth and ninth steps; and
- a fourteenth step of forming a diffusion layer having the other conductivity type by performing annealing after said eleventh step.

* * * * *